United States Patent [19]

Rogers et al.

[11] Patent Number: 4,571,819
[45] Date of Patent: Feb. 25, 1986

[54] METHOD FOR FORMING TRENCH ISOLATION STRUCTURES

[75] Inventors: Steven H. Rogers, Midwest City, Okla.; Randall S. Mundt, Colorado Springs; Denise A. Kaya, Woodland Park, both of Colo.

[73] Assignee: NCR Corporation, Dayton, Ohio

[21] Appl. No.: 667,181

[22] Filed: Nov. 1, 1984

[51] Int. Cl.[4] ............................................. H01L 21/95
[52] U.S. Cl. .................................. 29/576 W; 29/580; 148/1.5; 148/191; 148/DIG. 43; 148/DIG. 50; 148/DIG. 133; 357/49; 357/50; 357/54; 156/653; 427/93
[58] Field of Search ................ 29/576 W, 576 T, 580; 148/1.5, 191, DIG. 43, DIG. 50, DIG. 85, DIG. 86, DIG. 133; 357/49, 50, 54; 156/653, 657; 427/86, 93, 94, 95

[56] References Cited

U.S. PATENT DOCUMENTS

| | | | |
|---|---|---|---|
| 4,104,086 | 8/1978 | Bondur et al. | |
| 4,356,211 | 10/1982 | Riseman. | |
| 4,396,460 | 8/1983 | Tamaki et al. | 29/576 W X |
| 4,404,735 | 9/1983 | Sakurai. | |
| 4,506,434 | 3/1985 | Ogawa et al. | 29/576 W X |
| 4,519,128 | 5/1985 | Chesebro et al. | 357/49 X |

FOREIGN PATENT DOCUMENTS

| | | | |
|---|---|---|---|
| 0113248 | 7/1982 | Japan | 29/576 W |
| 0050540 | 3/1984 | Japan | 29/576 W |
| 8200782 | 9/1983 | Netherlands | 29/576 W |

OTHER PUBLICATIONS

Abbas, S. A., "Recessed Oxide Isolation Process" in *IBM Technical Disclosure Bulletin*, vol. 20, No. 1, Jun. 1977, pp. 144-145.

Rung et al., "Deep Trench Isolated CMOS Devices", IEDM 82, pp. 237-240.

Kurosawa et al., "A New Bird's-Beak Free Field Isolation Technology for VLSI Devices", IEDM 81, pp. 384-387.

*Primary Examiner*—Brian E. Hearn
*Assistant Examiner*—Alan E. Schiavelli
*Attorney, Agent, or Firm*—Wilbert Hawk, Jr.; Casimer K. Salys

[57] ABSTRACT

A method for forming trench isolation oxide using doped silicon dioxide which is reflowed at elevated temperatures to collapse any voids therein and produce surface planarity. An underlying layered composite selected from oxide, polysilicon and silicon nitride permits the formation and reflow of the doped isolation oxide and remains in place in the trench to contribute to the trench isolation structure.

16 Claims, 10 Drawing Figures

METHOD FOR FORMING TRENCH ISOLATION STRUCTURES

BACKGROUND OF THE INVENTION

This invention relates to techniques for electrically isolating semiconductor devices and components in monolithic integrated circuits. In particular, the invention is a method for forming void-free, planarized dielectric trench structures. The method uses doped oxide reflow to provide a void-free planar isolation layer and a multiple underlayer which functions as an etch stop and dopant/oxidation barrier.

Dielectric isolation techniques have been the preferred technology for isolating integrated circuits and their constituent devices and elements, at least in part because of the ability to closely pack the isolation dielectric and the circuit elements. Integrated circuit isolation by the so-called local oxidation of silicon (LOCOS) has been known for a number of years, as have the attendant problems. The well-known limitations of the LOCOS process include at least three factors which may constrain the process from applicability to future small geometry, highly dense LSI and VLSI structures. These limitations are, first, the formation of the so-called bird's beak oxide configuration and the associated encroachment of the field oxide beneath the oxidation mask. Encroachment by the bird's beak oxide limits the percentage of chip surface area which is available for device formation. Secondly, the limited thickness results in undesirably high circuit capacitances. Third, the characteristic non-planar surface topography makes it difficult to perform the increasingly high resolution photolithographic operations which are required to fabricate VSLI circuits. In turn, the decreased resolution increases the minimum feature sizes and minimum tolerances and, as a consequence, decreases the achievable device densities.

The use of LOCOS isolation has persisted, however, because of the past shortcomings of the available substitute isolation technologies. Typical trench isolation processes involve etching grooves about 1 to 6 microns deep into the semiconductor substrate, filling the grooves with a suitable dielectric and performing a planarization operation. The dielectric material typically is undoped silicon dioxide or polysilicon. Typical prior art approaches are discussed, for example, in Rung, Momose and Nagakubo, "Deep Trench Isolated CMOS Devices", *IEDM* 82, pp. 237-240. The Rung et al. article discusses a trench isolation process which involves oxidizing the silicon substrate trench sidewalls, filling the trench with polysilicon or deposited oxide, etching the poly/oxide, then capping the structure with oxide. Another typical trench isolation approach is described in the article "A New Bird's-Beak Free Field Isolation Technology For VLSI Devices", by Kurosawa, Shibata and Iizuka, *IEDM* 81, pp. 384-387. The Kurosawa et al. technique involves the selective etching of stressed silicon dioxide following confomal deposition, combined with a lift-off of the silicon dioxide over the active regions.

In particular, trench isolation technology has the inherent potential advantages of small width-to-depth ratios, relative process simplicity, well-defined vertical-wall isolation regions and surface planarity. Like other VSLI features, however, the width of isolation trenches must be scaled downward to near micron and even submicron size to achieve the densities required in VSLI and future monolithic integrated circuit technologies. Unfortunately, it becomes increasingly difficult to completely fill the narrow, yet relatively deep trench configurations which are used for VSLI isolation. The resulting tendency to form voids is well-known and is shown, for example, by the data of Bondur et al, U.S. Pat. No. 4,104,086. Bondur et al. discloses a process for eliminating voids by precisely tapering the walls of the trenches, which tapers vary in relation to the sizes of the trenches. FIG. 1 illustrates the data of Bondur et al., which show that for vertical side wall trenches, the deposited silicon dioxide forms negative sloping side walls and, thus, voids.

Several approaches have been proposed which have as their purpose the control or elimination of such voids.

For example, Riseman, U.S. Pat. No. 4,356,211, forms a composite dual-oxide trench isolation structure in which a first oxide layer is formed, then a layer of polysilicon is deposited, anisotrophically etched, and heavily doped at the upper edge of the trench to accelerate silicon dioxide formation at such upper edge. Thereby the voids are sealed by the differential oxidation rate of the polysilicon. Clearly the parameters of the Riseman process do not provide for applications in which trenches of varying dimension are being processed simultaneously.

The above-mentioned Bondur et al. U.S. Pat. No. 4,104,086 uses tapered trench sidewalls to control the depth of isolation oxide voids relative to the substrate surface in a silicon substrate which has a highly doped near-surface region. Briefly, the Bondur et al process involves (1) forming the trench to a tapered profile, as by the use of reactive ion etching (RIE); (2) growing a thin layer of thermal oxide in the trench outline; (3) depositing CVD oxide; (4) etching back the CVD oxide using RIE; and (5) optionally, annealing in steam at 900° to 950° C. to enhance the "quality" of the silicon dioxide. The data disclosed in the Bondur et al patent indicate the vertical walls (which, of course, are desirable for density and resolution) inherently product voids in the deposited silicon oxide (see FIG. 1 herein). Also, the voids are buried deeper in the oxide relative to the substrate surface as the trench width increases and the taper increases. Conversely, the voids are formed closer to the surface and to exposure by the planarization etch-back in the case of narrower, vertical grooves.

Sakurai, U.S. Pat. No. 4,404,735, discloses a process for forming trench isolation structures. Initially, dry etching such as plasma etching, reactive sputter etching or ion beam etching is used for form the trench. The trench is then covered with a thin layer of deposited silicon dioxide which is formed to a thickness of between 500 to 1,000 angstroms to prevent substrate heating by the subsequent laser reflow process, prevent doping of the substrate from the isolation layer, and to isolate the silicon isolation layer from the substrate. Next, a CVD layer is formed to a thickness which is less than the trench depth and less than one-half the trench width using silicon or doped glass (phosphosilicate glass, PSG). The PSG/silicon is subsequently reflowed by laser heating. Essentially, the Sakurai process is a laser reflow process for filling narrow trenches from a thin silicon or PSG layer. In other words, the trench-filling layer is formed to an initial shallow thickness within the trench and laser heating is used to redistribute material from outside the trenches into the trenches.

Apparently, the 500 to 1,000 Angstrom thickness of the blocking silicon dioxide layer is critical in that a minimum thickness is required to perform the heat-shielding and dopant-blocking functions, while, presumably, a maximum thickness is necessary for consistency with the state depth and width dimensions.

In view of the above-discussed constraints and difficulties associated with conventional trench isolation processes and structures, it is an object of the present invention to provide a method for forming a trench isolation structure which is free of voids.

Another object of the present invention is to provide a method for forming such a trench isolation structure which has planar surface topography over the trenches as well as the active regions.

Still another object of the present invention is to provide a process for forming void-free trench isolation structures which are suitable for use in high density monolithic integrated circuit structures such as VLSI circuits.

BRIEF SUMMARY

In one aspect, the method of the present invention comprises the steps of forming, in a substrate, a trench which has substantially vertical sidewalls; forming a thin, stress relief oxide layer in the trench outline; forming an etch-stop buffer layer in the trench outline; forming a dopant-blocking and oxidation blocking layer in the trench outline; forming a doped dielectric isolation layer on the structure; heating the resulting structure to reflow the dielectric collapse voids therein and smooth the outer surface of the isolation layer; etching the dielectric isolation layer to a level at or below the etch-stop buffer layer; heating the structure for a time sufficient to outgas the dopant, while at the same time such blocking layer prevents diffusion of the dopant into the underlying structure; and selectively etching the etch-stop buffer layer, as required, preparatory to further IC fabrication.

Optionally for relatively wide trenches (typically those wider than 5 microns), a polymer such as PMMA (polymethylmethacylate) may be formed on the dielectric after the reflow step to facilitate forming a smooth outer surface topology of the complete wafer.

In specific aspects of the preferred working embodiment, the stress relief layer is thermal oxide which is 300 to 1,000 Angstroms thick. The etch-stop layer is deposited polycrystalline silicon (polysilicon) which is 1,000 to 3,000 Angstroms thick. The blocking layer is silicon nitride formed to a thickness of 1,000 to 3,000 Angstroms thick to prevent doping and oxidation of the underlying polysilicon and other structural layers. The dielectric isolation layer is chemical vapor deposited (CVD) silicon oxide approximately 2.5 microns thick which contains approximately 3 to 9 weight percent dopants such as phosphorus or boron to provide the requisite reflow characteristics. Reflow itself is done at 950° to 1,150° C. in a steam or nitrogen ambient for a period of approximately 30 minutes to four hours, depending upon the thickness of the dielectric isolation layer and the dimensions of the trench. The etch-back and selective etch can be done by conventional RIE techniques. The outgassing step involves heating at about 1,000° to 1,200° C. in a nitrogen ambient for two to eight hours to deplete the dielectric surface of dopant and, optionally, to drive in surface adjacent diffusion regions such as the p/n wells used in CMOS integrated circuits.

In an alternative aspect of the present invention, the polysilicon etch stop layer is formed on the silicon nitride blocking layer, rather than vice versa. This approach eliminates possible interaction between the glass isolation layer and the nitride, which can occur when the nitride is formed on the polysilicon. Typically, an oxidizing reflow ambient is not used with this poly-on-nitride configuration, because the resulting polysilicon oxidation can consume the poly etch stop layer.

In still another alternative, a poly-nitride-poly-oxide sequence of layers can be used. The outermost poly layer in this configuration acts as a passivation barrier over the nitride to eliminate nitride reaction with the glass isolation layer. When reflow is done in an oxidizing ambient, oxidation of the poly helps to fill in the trench. The nitride blocks oxidation of the innermost poly layer during reflow and limits any poly consumption to the outermost poly layer. In blocking oxidation of the innermost poly layer, the nitride permits the use of an oxidizing reflow ambient.

DETAILED DESCRIPTION

The present invention is a trench isolation technology which utilizes the reflow characteristics of doped silica glass at elevated temperatures to compensate for the tendency for form voids in the trenches of varying dimensions which are required for small geometry, high-density, monolithic integrated circuits. The process therby provides a high-quality, void-free planar trench isolation structure. In one aspect, the use of reflowed doped silica glass is made possible by the preliminary formation of a silicon nitride barrier layer which prevents doping and oxidation of the underlying structure, particularly the semiconductor substrate; and underlying polysilicon layer which provides an etch-stop during the oxide planarization etchback; and an underlying silicon oxide layer which decreases stress in the novel four-layer composite trench structure. The process is believed unique in its approach to the use of vertical sidewalls in trench structures of various widths. These vertical sidewalls minimize the effective wafer area allocated to the trenches. In addition, the process results in a planar wafer surface suitable for use with high resolution photolithography. Foremost, these objectives are obtained through the use of conventional fabrication techniques, and without imposing elaborate trench shape or dimensional controls.

Figure 2:
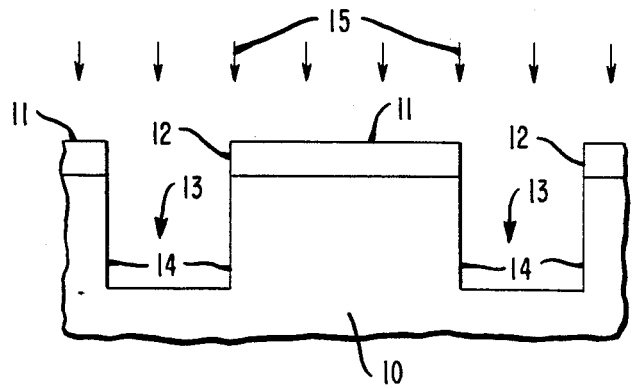
FIGS. 2 through 7 are cross-sectional representations of a preferred process for fabricating the void-free silicon dioxide composite trench isolation structures of the present invention.

Referring to FIG. 2, there is shown a semiconductor substrate 10, typically of silicon. As an example, for NMOS integrated circuits the substrate would be p⁻ silicon having a resistivity of 1 to 20 ohms - centimeter. A typical CMOS starting structure would be an n⁻ epitaxial layer on an n+ substrate. The substrate 10 can be masked using any of a number and combinations thereof, as well as by the exemplary photoresist mask which is shaped by exposure to ultraviolet radiation. In addition, mask compositions suitable for X-Ray or ion beam exposure can be used. Using photoresist, a layer thereof is formed on the substrate 10, then is exposed and developed to produce the etch mask 11 which has openings 12 corresponding to the desired trench width. Note that the dimensions of the drawings herein are chosen for convenience of representation, are not to scale, and according to the invention are subject to variation.

Subsequently, the trench is etched to a typical depth of 1 to 6 microns, preferably using an anisotropic etch process to produce a trench 13 having vertical sidewalls 14-14. One preferred etch process is reactive ion etching using a fluorine etchant gas such as nitrogen trifluoride ($NF_3$). In reactive ion etching, the mechanical component or ion bombardment component 15 dominates the chemical reaction component and provides the vertical sidewalls which are desirable in order to provide sufficient dielectric width for effective isolation without lateral encroachment into active device regions.

Figure 3:
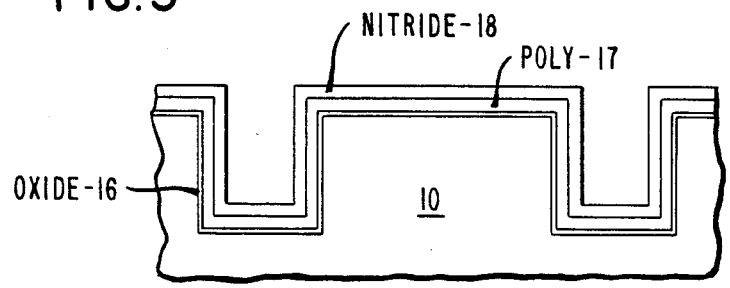

Referring to FIG. 3, after the trench etching, the mask 11 is removed such as by a plasma ashing process. Next, a stress relief oxide layer 16 is formed to a thickness of about 300 to 1,000 Angstroms by thermal oxidation in steam at 950° to 1,150° C., or by chemical vapor deposition (CVD). The oxide layer 16 provides stress relief between the silicon substrate 10 and the overlying layer, in this instance a polycrystalline silicon etch-stop layer 17 which is formed to a thickness of about 1,000 to 3,000 Angstroms, for example, by the LPCVD technique (low pressure chemical vapor deposition) using silane in argon and hydrogen at 600°-800° C. The poly layer 17 prevents etching of the underlying structure, particularly the substrate, during the planarization process. The primary purpose of the oxide layer 16 is stress relief of the substrate 10, to preserve the electrical integrity of the substrate.

Referring still further to FIG. 3, the silicon nitride barrier layer 18 is then formed to a thickness of 1,000 to 2,500 Angstroms on the polysilicon layer 17, preferably by low pressure chemical vapor deposition using silane and ammonia and a reaction temperature of about 800° C. The silicon nitride layer 18 provides a barrier to doping and oxidation of the underlying structure, particularly substrate 10, during subsequent processing. Thereby, silicon nitride layer 18 permits formation and reflow of the doped isolation oxide and subsequent outgassing of the dopant in the isolation oxide without affecting the substrate or polysilicon or the rest of the underlying structure.

Figure 4:
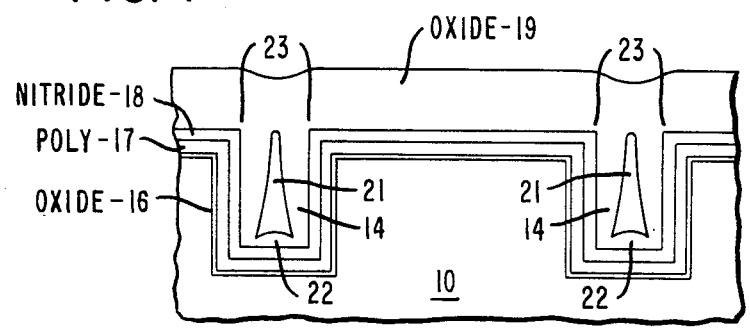

Next, referring to FIG. 4, the doped silicon dioxide glass layer 19 can be formed to a thickness of about 2.5 microns containing 3-9 weight percent of impurities such as phosphorus or boron, e.g., using the low pressure chemical vapor deposition technique. Typically, the reactants silane and oxygen are used, with phosphine as the n-type dopant, and a reaction temperature of about 500°-800° C.

Figure 1:
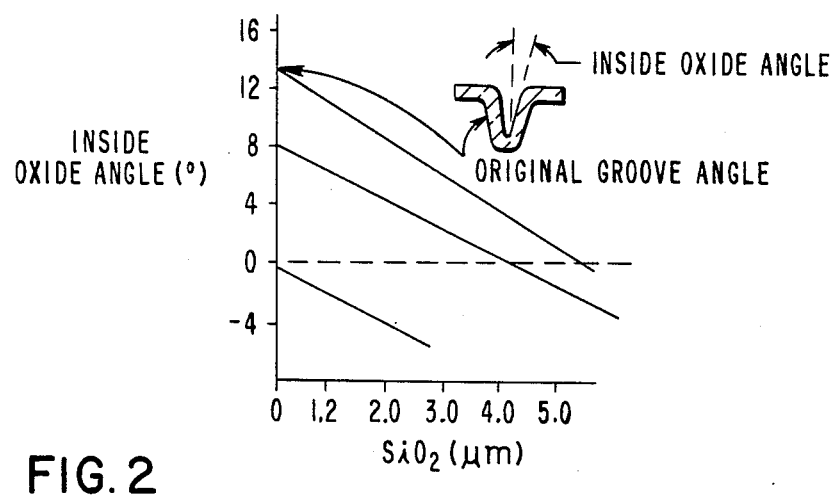
FIG. 1 illustrates prior art data which demonstrates that formation of dielectric such as silicon dioxide in vertical sidewall trenches produces a negatively sloped dielectric walls and voids.

As shown in FIG. 4, the resulting silicon dioxide layer 19 includes voids 21-21, which is typical when silicon dioxide or other dielectric layers are formed in deep trenches. The voids occur because the arrival angles of the depositing silicon dioxide at the bottom 22 and sidewalls 14-14 of the trench are small in comparison to the arrival angle at the top edges 23-23 of the trench. This produces relatively low deposition growth rates at the bottom and sides in comparison to the top and edge. The deposition rate differential produces the negatively sloped sidewalls which are evidenced by the data of FIG. 1, with the result that the fast growing oxide in the edge regions 23-23 closes up the opening of the trench before the bottom regions are filled. The resulting voids 21-21 are not filled in by subsequent oxide growth or by the application of planarization materials such as polymer layers. The voids would be exposed during the subsequent etchback which is used to planarize the doped glass, creating an open receptacle for process chemical or impurities and allowing subsequently deposited metallization to flow into the voids and short other devices and components along the trench.

Figure 5:
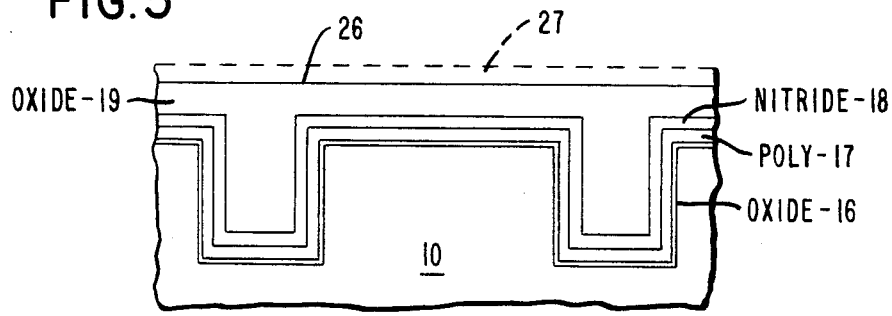

In the present process, the doped glass is melted and reflowed by applying a temperature of about 950° to 1,150° C. in steam (oxidizing) or nitrogen (non-oxidizing) ambient for about 30 minutes to four hours depending upon the glass thickness and the trench dimensions. See FIG. 5. The range of times results from the faster reflow which occurs as the process temperature is increased and from the requirement of longer processing times for thicker silicon dioxide layers 19. This process collapses the voids 21-21 and, for trench width dimensions of up to about 5 microns, reflows the upper surface 26 of the glass to a substantially level topography. During the glass deposition and reflow process steps, the silicon nitride layer 18 provides a barrier to oxidation and doping of the underlying polysilicon layer 17.

For trench widths $\geq 5$ microns, planarization is aided by depositing after the reflow a layer 27 of polymer such as PMMA to a thickness which is appropriate to the particular trench depth and width being used. It should be noted that one of the advantages of the present process is its adaptability to a wide range of trench dimensions, e.g., trench widths of one micron to 50 microns. According to this embodiment, planarization of the underlying glass is carried out by using an etch which removes PMMA and glass at substantially equal rates.

Figure 6:
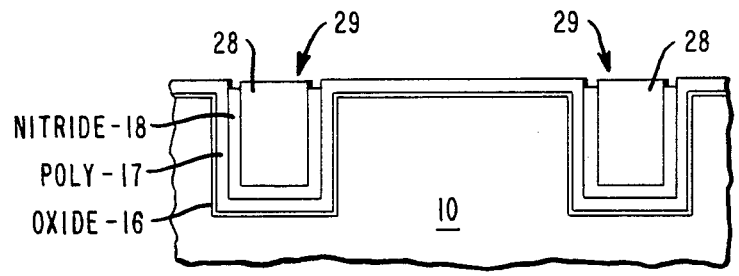

Next, as shown in FIG. 6, the silicon dioxide isolation layer 19 is etched back so that the surface 28 of the resulting glass field isolation regions 19-19 of the trench structure 29-29 is level with or below the surface of the polysilicon etch-stop/buffer layer 17. The etch can be done using a selective wet chemical etchant such as buffered hydrogen fluoride, or using dry etching such as reactive ion etching with $CHF_3$ etchant gas. As shown in FIG. 6, the use of an RIE oxide etch also removes the silicon nitride layer 18 outside the trench confines. If the optional polymer layer has been used, it can be removed using the same reactive ion etching process which is applied to remove the silicon dioxide. Preferably, the etchant used does not attack poly, so that the polymer 27, oxide 19 and nitride 18 can be etched using the poly as an etch stop and thereby prevent overetching into regions such as the active regions 31.

The next step is to outgas the phosphorus or boron dopant from the trench oxide 19-19 at a temperature of about 1,000° to 1,200° C. in a nitrogen ambient for about two to eight hours. This step depletes the surface of the glass of the dopant and may also be used, for example, for the well drive-in of CMOS integrated circuits. During the outgassing thermal cycle, the silicon nitride layer again serves as a barrier to prevent doping or oxidation of the underlying trench structure including the substrate. It is no doubt recognized that even small amounts of dopant diffused through the barrier into silicon substrate 10 create parasitic current leakage paths.

Figure 7:
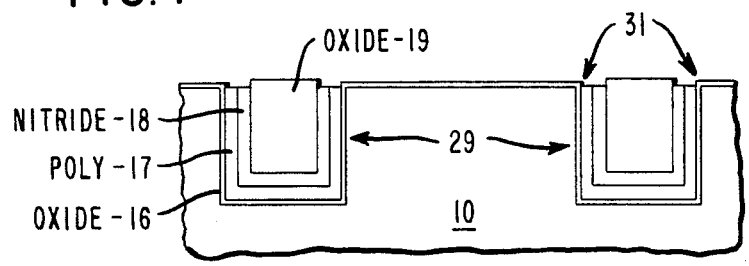

Next, and referring to FIG. 7, the polysilicon layer 17 is removed from the active regions such as 31-31. The polysilicon can be removed using reactive ion etching or by wet chemical etching. Standard integrated circuit processing may then proceed.

The resulting trench structures 29-29 shown in FIG. 7 form the narrow, yet relatively deep, vertical sidewall, void-free structures which are necessary for small geometry, high-density, integrated circuits. In addition, the silicon nitride blocking layer 18, the polysilicon etch-stop/buffer layer 17 and the stress relief oxide layer 16 remain in place and contribute to the dielectric isolation. Foremost, the structure is created without critical reliance on exotic equipment or highly refined trench shape control procedures.

Figure 3A:
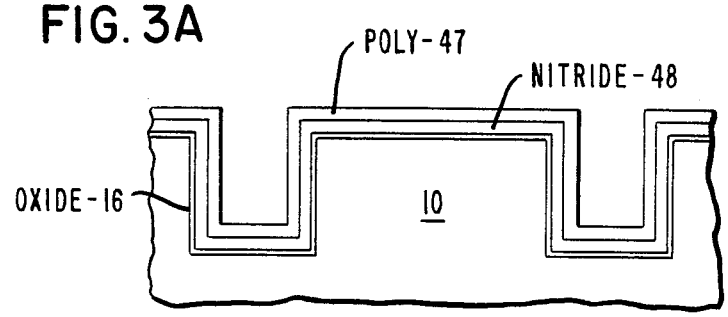
FIG. 3A and 3B are cross-sectional representations of alternative composite structures which may be used in the structure and process of the present invention.

In the alternative embodiment of the invention shown in FIG. 3A, the polysilicon etch-stop layer 47 is formed on the silicon nitride blocking layer 48, rather than vice versa. This poly-overnitride approach eliminates possible interaction between the glass isolation layer 19 and the nitride, which can occur when the nitride is formed on the poly (see FIGS. 3 and 4). Typically, an oxidizing reflow ambient is not used with the poly-on-nitride configuration of FIG. 3A, because the resulting polysilicon oxidation can consume the poly etch-stop layer 17. Otherwise, the fabrication process for the poly-nitride-oxide composite of FIG. 3A is similar to that described relative to the nitride-poly-oxide composite of FIG. 3 with the exception that the nitride 48 is under the poly etch-stop layer 47 and thus typically cannot be removed during the etch back of glass 19. Instead, the etching sequence is glass 19, poly 47 and then nitride 48.

The poly 47, nitride 48 and oxide 16 of FIG. 3A perform the same functions—etch-stop, oxidation and dopant blocking, and stress relief—as do the poly 17, nitride 18 and oxide 16 of FIG. 3.

Figure 3B:
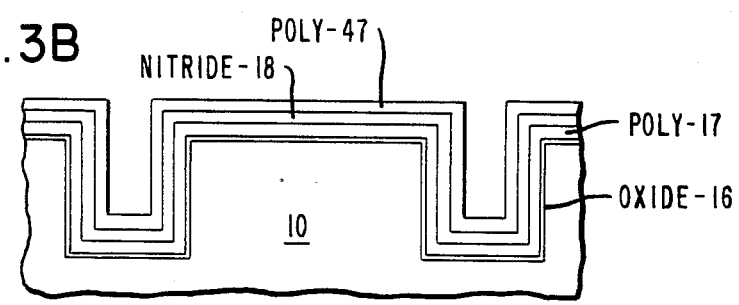

Referring to FIG. 3B, in still another alternative embodiment of the present invention, a poly-nitride-poly-oxide sequence of layers is used. Here the outermost poly layer 47 acts as a barrier for the nitride 18 to eliminate any nitride reaction with the glass isolation layer 19, e.g., during the oxide reflow. Also, during reflow in an oxidizing ambient, oxidation of the poly 47 helps fill in and level the trench structures. The nitride 18 in turn blocks oxidation of the innermost poly layer 17 and thereby limits any poly consumption during the reflow step to the outermost poly layer 47. Thus, the nitride layer 18 preserves the innermost poly layer 17 and permits the use of an oxidizing ambient during reflow. The result is that the nitride 18 and poly 17 perform the same respective oxidation and dopant blocking and etch-stop functions as do the nitride 18 and poly 17 in FIG. 3. The fabrication process for the polynitride-poly-oxide composite structure involves obvious modifications of the nitride-poly fabrication of FIG. 3, involving primarily the addition of a second poly CVD step. Typically, if poly 47 is not consumed during the reflow step, the glass 19, poly 47, nitride 18 and poly 17 layers are removed sequentially. If the poly 47 is totally consumed during the reflow, the removal sequence for the FIG. 3 structure can be used.

Figure 8:
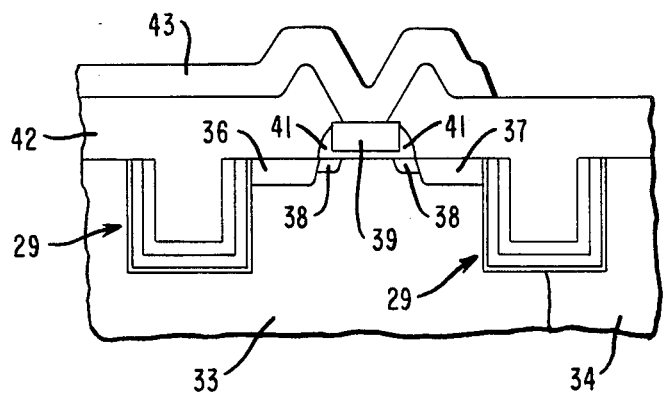
FIG. 8 is an exemplary IC structure based upon the trench isolation process and structure of the present invention.

Referring to FIG. 8, there is shown one example of a MOSFET structure based upon the trench isolation structures 29 of the present invention. In the illustrated case, an NMOS FET of a complementary structure is shown formed in the p-well 33 of an n-type epitaxial layer 34. The FET includes source and drain diffusions 36 and 37 and LDD implants 38, all of which are self-aligned with the polysilicon gate 39, as well as gate sidewall spacers 41, interlevel dielectric 42 and aluminum interconnects 43. Quite obviously, this is only one possible application among the various NMOS, PMOS, CMOS, bipolar and other applications of the present trench isolation structure and process.

Having thus described preferred and alternative approaches for implementing our process for forming doped oxide filled trenches for semiconductor device isolation, what is claimed is:

1. A process for forming a composite trench isolation structure in a substrate, comprising: forming a trench in the substrate; forming a polysilicon etch-stop layer on the trench walls; forming an oxidation-and dopant-blocking silicon nitride layer on the etch-stop layer; filling the trench will silicon dioxide doped to approximately three to nine weight percent of n-type or p-type impurities; heating the resulting structure for a time sufficient to reflow the oxide to thereby collapse voids therein and provide a relatively smooth upper surface; etching back the oxide to remove the oxide outside the trench areas; heating the resulting structure to outgas the impurity dopant from the surface-adjacent region of the oxide; simultaneously or separately to the oxide etch-back step, removing the nitride blocking layer outside the trench; and removing the etch-stop layer from at least selected regions outside the trench; whereby the nitride blocking layer prevents oxidation and doping the underlying structure during the reflow and outgassing steps and the polysilicon layer prevents etching of the underlying structure during the oxide and nitride removal.

2. The process of claim 1 wherein prior to the formation of the etch-stop layer, a silicon dioxide stress relief layer is formed on the trench walls.

3. The process of claims 1 or 2, further comprising forming a second layer of polysilicon over the nitride prior to forming the silicon dioxide isolation layer, the second polysilicon layer preventing interaction between the nitride and the oxide isolation layer during the reflow step; and the process still further comprising removing the second poly layer as required after removal of the oxide isolation layer.

4. A process for forming a composite trench isolation structure in a substrate, comprising: forming a trench in the substrate; forming an oxidation-and dopant-blocking silicon nitride layer on the trench walls; forming a polysilicon etch-stop layer on the blocking layer; filling the trench with silicon dioxide doped to approximately three to nine weight percent of n-type or p-type impurities; heating the resulting structure for a time sufficient to reflow the oxide to thereby collapse voids therein and provide a relatively smooth upper surface; etching back the oxide to remove the oxide outside the trench areas; heating the resulting structure to outgas the impurity dopant from the surface-adjacent region of the oxide; removing the etch-stop layer as required from selected regions outside the trench; and removing the nitride blocking layer from selected regions outside the trench; whereby the nitride blocking layer prevents oxidation and doping of the underlying structure during the reflow and outgassing steps and the polysilicon layer prevents etching the underlying structure during the oxide removal.

5. The process of claim 4 wherein prior to the formation of the silicon nitride layer, a silicon dioxide stress relief layer is formed on the trench walls.

6. A process for forming a trench oxide isolation structure in a substrate, comprising: forming an etch mask on the substrate to define the trench surface configuration; etching the substrate in the presence of the mask; forming a stress relief layer on the trench walls; forming an etch-stop layer on the stress relief layer; forming an oxidation and dopant blocking layer on the etch-stop layer; filling the trench with silicon dioxide isolation dielectric doped to approximately 3–9 weight percent with n-type or p-type impurities; heating the resulting structure for a time sufficient to reflow the isolation oxide layer to thereby collapse voids therein and provide a relatively smooth upper surface; etching back the oxide to a desired thickness to expose the blocking layer; heating the resulting structure to outgas the impurity dopant from the surface adjacent region of the oxide; removing the blocking layer from at least selected regions outside the trench structure; and removing the etch-stop layer from selected regions outside the trench structure.

7. The process of claim 6 wherein the stress relief layer is silicon dioxide.

8. The process of claim 6 or 7 wherein the etch-stop layer is silicon.

9. The process of claim 6 or 7 wherein the etch-stop layer is silicon deposited to a thickness of about 1,000 to 3,000 Angstroms.

10. The process of claim 6 or 7 wherein the blocking layer is silicon nitride.

11. The process of claim 6 wherein the stress relief layer is silicon oxide, the etch-stop layer is silicon and the blocking layer is silicon nitride.

12. The process of claim 6 wherein the stress relief layer is silicon oxide about 300 to 1000 Angstroms thick, the etch-stop layer is silicon about 1000 to 3000 Angstroms thick, and the blocking layer is silicon nitride about 1,000 to 3,000 Angstroms thick.

13. The process of claim 6 or 12, wherein the isolation oxide is reflowed at a temperature of about 950° to 1,150° C. in an oxidizing or non-oxidizing ambient.

14. The process of claim 6 wherein the outgas heating step is performed at approximately 1,000° to 1,200° C. in a nitrogen ambient.

15. The process of claim 1, 11 or 12, wherein a planarization polymer layer is formed on the isolation oxide after the reflow heating step and prior to the etchback step, and wherein the trench width is greater than or equal to approximately 5 microns.

16. The process of claims 11 or 12, further comprising forming a second layer of polysilicon over the nitride prior to forming the silicon dioxide isolation layer, the second polysilicon layer preventing interaction between the nitride and the oxide isolation layer during the reflow step; and the process still further comprising removing the second poly layer as required after removal of the oxide isolation layer.

* * * * *